US008103992B1

(12) United States Patent
Chan et al.

(10) Patent No.: US 8,103,992 B1
(45) Date of Patent: Jan. 24, 2012

(54) RAPID REROUTING BASED RUNTIME RECONFIGURABLE SIGNAL PROBING

(75) Inventors: Chi Bun Chan, San Jose, CA (US); Jingzhao Ou, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 583 days.

(21) Appl. No.: 12/114,572

(22) Filed: May 2, 2008

(51) Int. Cl.
*G06F 17/50* (2006.01)
(52) U.S. Cl. ..................................... 716/100
(58) Field of Classification Search .............. 716/1, 4, 716/100
See application file for complete search history.

(56) References Cited

U.S. PATENT DOCUMENTS

| | | | |
|---|---|---|---|
| 6,363,517 B1 * | 3/2002 | Levi et al. .................. | 716/6 |
| 7,058,177 B1 * | 6/2006 | Trimberger et al. ........... | 380/28 |
| 7,310,794 B1 * | 12/2007 | Squires ........................ | 716/117 |
| 7,412,635 B1 * | 8/2008 | Trimberger .................. | 714/725 |
| 7,424,655 B1 * | 9/2008 | Trimberger .................. | 714/725 |
| 7,541,833 B1 * | 6/2009 | Neuendorffer et al. ......... | 326/38 |
| 7,558,995 B1 * | 7/2009 | Simmons et al. .............. | 714/724 |
| 7,600,210 B1 * | 10/2009 | Mason et al. ................. | 716/138 |
| 7,620,863 B1 * | 11/2009 | Trimberger .................. | 714/725 |
| 7,640,526 B1 * | 12/2009 | Blodget et al. ................ | 716/138 |
| 7,673,271 B1 * | 3/2010 | Becker et al. ................. | 716/101 |
| 7,890,917 B1 * | 2/2011 | Young et al. .................. | 716/117 |
| 2006/0117274 A1 * | 6/2006 | Tseng et al. ................... | 716/1 |
| 2006/0171463 A1 * | 8/2006 | Hanamura et al. ........ | 375/240.13 |

* cited by examiner

*Primary Examiner* — Suchin Parihar
(74) *Attorney, Agent, or Firm* — Kevin T. Cuenot (57) ABSTRACT

A computer-implemented method of probing a design under test (DUT) instantiated within a programmable logic device (PLD) can include disabling a clock signal provided to the DUT (340) and generating a partial bitstream specifying a new probe for the DUT (335). The partial bitstream can be merged with configuration data read-back from the PLD to create an updated partial bitstream (360, 365, 370). The updated partial bitstream can be loaded into the PLD (375). The clock signal provided to the PLD can be started and the DUT can continue to operate (380, 385).

18 Claims, 3 Drawing Sheets

RAPID REROUTING BASED RUNTIME RECONFIGURABLE SIGNAL PROBING

FIELD OF THE INVENTION

The embodiments disclosed herein relate to integrated circuit devices (ICs). More particularly, the embodiments relate to reconfigurable signal probing within an IC.

BACKGROUND OF THE INVENTION

It is often useful to observe the internal signals of a circuit for purposes of debugging and/or verification. With respect to programmable logic device (PLD) types integrated circuit devices (ICs), a variety of techniques exist that allow a designer to observe the internal signals of a circuit design once instantiated within a PLD. One technique relies upon probes that are inserted into the physical implementation of the circuit within the PLD. Probes are implemented using the programmable logic elements of the PLD that are otherwise available for implementing the circuit design, also referred to as the design under test (DUT). The probes can be instantiated within the DUT at user-selected locations.

In some cases, each probe can be communicatively linked with an input/output (I/O) pin of the PLD via a physical route. The I/O pins that are coupled to the probes can be communicatively linked with a host computer executing analysis software. Accordingly, each probe requires an I/O pin in order to observe the signal collected by that probe. In other cases, a logic analyzer can be instantiated within the PLD to operate cooperatively with the DUT. Signals of interest collected by probes are routed to the "in-circuit" logic analyzer within the PLD. Samples can be sent from the PLD to a host computer executing suitable analysis software. As samples are usually sent through a dedicated interface, the number of I/O pins of the PLD that are reserved for probing, as compared to directly coupling probes to I/O pins, may be reduced.

When using probes, signals of interest must be identified prior to implementation of the circuit design within the PLD. The programmatic description of the circuit design must be modified to specify probes at desired locations, e.g., at signal paths of interest. After probes are inserted, the circuit design is synthesized, mapped, placed, routed, and converted into a bitstream. The bitstream can be loaded into the PLD to instantiate the DUT with any specified probes included therein.

During testing and/or verification, the particular signals that a designer may wish to observe can change. In other cases, the number of signals that a designer may wish to observe may be more than the number of signals that can be probed at any given time, whether a constraint of the in-circuit logic analyzer or a limitation of the number of I/O pins available on the PLD. Both situations are not uncommon given the complexity of modern circuit designs.

To insert new probes and/or remove existing probes, the programmatic description of the circuit design must be altered. Once modified, the circuit design can be re-synthesized, re-mapped, re-placed, re-routed, and converted to a bitstream. This process can require a significant amount of time, e.g., hours or possibly an entire day, making it difficult to quickly reconfigure probes during execution of the DUT.

Another technique of observing internal signals of a circuit design within a PLD is to read portions of configuration data directly form the PLD during execution of the DUT. PLDs provide a configuration read-back function that allows frames of configuration data to be output to a host computer system for analysis. This allows a developer to observe internal signals of a DUT at a specific execution time without the use of probes.

To read a frame of configuration data from the PLD, the clock of the PLD is stopped. A selected frame of configuration data can be read from the PLD. The frame indicates the entire state of the circuit, e.g., memory content, state of logic elements, and state or connectivity of routing resources, for those elements of the PLD that are configured by the selected frame. The state of a signal of interest, therefore, can be ascertained by determining the state of the component that drives or outputs the signal of interest.

While configuration read-back allows a designer to observe most of the internal signals of DUT at a specific time during execution, to obtain the current value of a signal the DUT clock must be stopped. After stopping the clock, the selected configuration frame can be read out to a host computer through an Internal Configuration Access Port (ICAP) or a Joint Test Action Group (JTAG) boundary scan interface. ICAP and/or JTAG interfaces, however, typically run at slower speeds than the PLD. For example, it often takes several clock cycles to read a single frame of configuration data from the PLD. If a designer wishes to continuously probe signals, the desired frames must be read-back on each clock cycle of the simulation, which can significantly slow down the speed of debugging and verification since the DUT clock must be continually stopped and restarted.

SUMMARY OF THE INVENTION

The embodiments disclosed herein relate to reconfiguring probes within a programmable logic device (PLD) type of integrated circuit. While embodiments disclosed herein can be employed during runtime of a device under test (DUT) instantiated within the PLD, some embodiments are able to be implemented in other types of integrated circuits that have reconfigurable logic.

One embodiment of the present invention can include a computer-implemented method of probing a DUT instantiated within a PLD. The computer-implemented method can include disabling a clock signal provided to the DUT within the PLD, generating a partial bitstream including a new probe for the DUT, and merging the partial bitstream with configuration data read-back from the PLD to create an updated partial bitstream. The updated partial bitstream can be loaded into the PLD. The clock signal to provided to the PLD can be started such that the DUT continues to operate. In one aspect, the DUT can continue to operate without losing state.

The computer-implemented method can include removing an obsolete probe by deleting routing information for the obsolete probe from a physical netlist for the DUT. Accordingly, the partial bitstream can specify removal of the obsolete probe.

Generating a partial bitstream can include specifying a connection for the new probe, wherein the connection does not specify routing information for the new probe, and determining a route for the connection. Generating a partial bitstream also can include generating the partial bitstream to include only frames that specify at least one of the new probe or removal of the obsolete probe.

Merging the partial bitstream with configuration data read-back from the PLD can include identifying each frame of the partial bitstream, reading back a frame from the PLD that corresponds to each frame of the partial bitstream, and merging each frame of the partial bitstream with the corresponding frame read-back from the PLD.

Merging the partial bitstream with configuration data read-back from the PLD also can include identifying each frame from the partial bitstream and reading back a frame from the PLD that corresponds to each frame of the partial bitstream. The updated partial bitstream can be generated by combining logic element state information from each frame read-back from the PLD and interconnect data from each corresponding frame of the partial bitstream.

Merging the partial bitstream with configuration data read-back from the PLD also can include forming the updated partial bitstream by replacing routing data of the portions of configuration data read-back for the PLD with routing data from the partial bitstream.

Generating a partial bitstream can include adding a connection to the physical netlist specifying the new probe and routing the connection using a re-entrant routing function, wherein pre-existing routing information of the physical netlist is not disturbed and routing information for the new probe is added.

Another embodiment of the present invention can include a computer-implemented method of probing a DUT instantiated within a PLD including disabling a clock signal to the DUT, wherein the DUT is instantiated by a bitstream loaded into the PLD, removing an obsolete probe from a physical netlist of the DUT, and adding a connection for a new probe to the physical netlist. The computer-implemented method further can include creating a route, within the physical netlist, for the connection, generating a partial bitstream comprising only frames that differ from corresponding frames of the bitstream, reading each frame of configuration data from the PLD corresponding to a frame of the partial bitstream, and merging frames of the partial bitstream with corresponding frames of the configuration data read from the PLD to create an updated partial bitstream. The updated partial bitstream can be loaded into the PLD and the clock signal to the DUT can be started. The DUT can continue to operate without losing state.

Generating a partial bitstream can include outputting, as the partial bitstream, only frames of configuration data that differ from corresponding frames of the bitstream. Merging frames can include replacing routing data of the frames of the configuration data read from the PLD with routing data from the frames of the partial bitstream to generate the updated partial bitstream.

Yet another embodiment of the present invention can include a computer program product including a computer-usable medium having computer-usable program code that, when executed by a data processing system, causes the data processing system to perform the various steps and/or functions disclosed herein.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to probing a design under test (DUT) instantiated with an integrated circuit (IC). More particularly, the embodiments disclosed herein relate to reconfigurable signal probing of a DUT implemented within a programmable logic device (PLD) type of IC. In accordance with the embodiments disclosed herein, the removal of probes that are no longer used or needed from the DUT and the insertion of new probes into the DUT can be implemented through the use of rapid re-routing of the PLD. The probes can be reconfigured to monitor different signals within the DUT during execution of the DUT. The reconfiguration of probes can be implemented without loss of state in the DUT and in a manner that does not require excessive time for processing or re-implementing the DUT.

Figure 1:
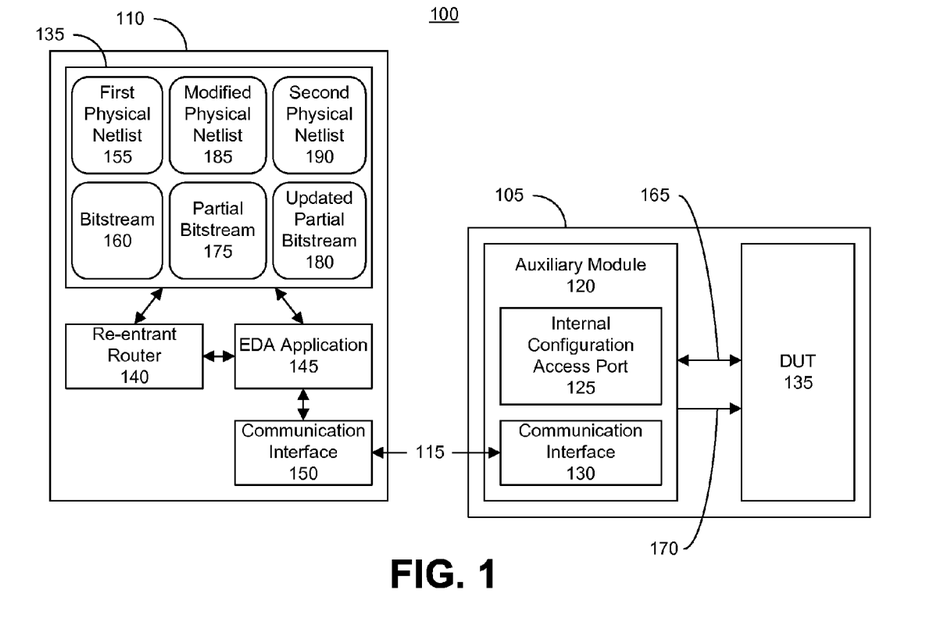
FIG. 1 is a block diagram illustrating a system for reconfigurable signal probing within a programmable logic device (PLD) in accordance with one embodiment of the present invention.

FIG. 1 is a block diagram illustrating a system 100 for reconfigurable signal probing within a PLD in accordance with one embodiment of the present invention. As noted, probes can be removed from, and inserted into, a DUT while the DUT executes within the PLD. The system 100 can include a PLD 105 and a host computer 110. The PLD 105 can be disposed on a circuit board or other IC mounting platform that can be coupled to the host computer 110 through a communication link 115. Like numbers will be used to refer to the same items throughout this specification.

The PLD 105 can be any of a variety of well known types of integrated circuits that can be programmed to perform specified logic functions. The PLD 105 can be implemented as, for example, a Field Programmable Gate Array (FPGA), a Complex Programmable Logic Device (CPLD), a Programmable Logic Array (PLA), a Programmable Array Logic (PAL) device, or the like. The functionality of the PLD 105 can be controlled by configuration bits, referred to as a bitstream, provided to the PLD 105 for that purpose. The bitstream can be stored in volatile memory (e.g., static memory cells, as in FPGAs and some CPLDs), in non-volatile memory (e.g., FLASH memory, as in some CPLDs), or in any other type of memory cell of the PLD 105.

It should be appreciated that the PLD 105 can also be implemented using other technologies, e.g., fuse or antifuse technology. Accordingly, the terms "PLD" and "programmable logic device" can include but are not limited to the devices noted herein and may encompass devices that are only partially programmable. For example, one type of PLD can include a combination of hard-coded transistor logic and a programmable switch fabric that programmably interconnects the hard-coded transistor logic.

The PLD 105 can be loaded with a bitstream, e.g., bitstream 160, that instantiates an auxiliary module 120 having an Internal Configuration Access Port (ICAP) 125 and a communication interface 130. The bitstream further can instantiate the DUT 135 within the PLD 105. The auxiliary module 120 allows the host computer 110 to communicate with the DUT 135. For example, the auxiliary module 120 allows the host computer 110 to provide control signals, configuration information, and the like to the DUT 135. The auxiliary module 120 also allows the host computer 110 to read configuration information from the PLD 105 and operational data, e.g., signal values, from the DUT 135. As shown, the auxiliary module 120 can communicate with the DUT 135 via one or more data signals 165 and provide a clock signal 170 to the DUT 135.

The ICAP 125 is a configuration interface that supports partial reconfiguration of the PLD 105. The ICAP 125 is accessible within the fabric of the PLD 105 in that the ICAP 125 can interact with configurable logic of the PLD 105. The host computer 110, working in conjunction with the ICAP 125, can load a partial bitstream, e.g., partial bitstream 175 and/or updated partial bitstream 180, into the PLD 105. In another example, a Joint Test Action Group (JTAG) interface can be used to support or implement partial reconfiguration of the PLD 105. The phrase "partial bitstream," as used herein, can refer to a bitstream that has a number of frames of configuration data that is less than the total number of frames of configuration data that a complete or full bitstream includes. A full bitstream, or simply a bitstream, includes all frames needed to program the PLD 105. A partial bitstream typically includes only frames that are different from corresponding frames of a base bitstream from which the partial bitstream was derived or to which the partial bits ream is related.

The communication interface 130 can receive communications from the host computer 110 via the communication link 115 and send communications from the PLD 105 to the host computer 110 via the communication link 115. The communication link 115 can be implemented as a JTAG connection, an Ethernet connection, a Universal Serial Bus (USB) connection, Peripheral Connect Interface (PCI), PCI-X, or any of a variety of other communication links known in the art. Accordingly, the communication interface 130 can encode and decode, e.g., packetize and de-packetize, data as may be required for communicating with the host computer 110.

The host computer 110 can be implemented as a data processing system, e.g., a computer or computer system, which can store and/or execute program code. The host computer 110 can include at least one processor coupled directly or indirectly to memory elements, e.g., memory 135, through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices such as, for example, keyboards, displays, pointing devices, etc., can be coupled to the host computer 110 either directly or through intervening I/O controllers. Network adapters may also be coupled to the host computer 110 to enable the host computer 110 to become coupled to other data processing systems or remote printers or storage devices through intervening private or public networks. Modems, cable modems, and Ethernet cards are just a few of the currently available types of network adapters.

The host computer 110 can include, and execute, a re-entrant router 140, an Electronic Design Automation (EDA) application 145, and a communication interface 150. The re-entrant router 140 can be a routing application or function that can determine routes for signal connections specified by a circuit design. As used herein, a connection can refer to, or define, a source node and a load node. Within a PLD, for example, the re-entrant router 140 can select the particular wires, or routing resources, that will be used to physically couple a source with a load of a connection and insert such information within a physical netlist.

Whereas a conventional router typically operates to generate routes when connections of the PLD 105 are to be routed using any routing resources of the PLD, the re-entrant router 140 can operate in cases where a significant portion of the routing resources of the circuit design, as well as components, are not available for use, e.g., cannot be changed. That is, the re-entrant router 140 can generate and output a route for a connection in cases where nearly all other signals of a design, or all other signals of a design, have been routed previously. As used herein, "outputting" and/or "output" can mean, for example, writing to a file, writing to a user display or other output device, sending or transmitting to another system, exporting, or the like. The re-entrant router 140 can generate a route for the connection without disturbing or changing any existing routes.

The EDA application 145 can perform various processing functions with respect to a physical netlist, can provide instructions to the PLD 105, and control the configuration and partial reconfiguration process as applied to the PLD 105 and the DUT 135. The communication interface 150 can execute within the host computer 110 to perform functions such as coding and decoding data and further can control the particular network adapter through which the computer system 110 communicates with the PLD 105.

In operation, the EDA application 145 can process a first physical netlist 155. The first physical netlist 155 can include complete placement and routing information for the PLD 105. For example, the first physical netlist 155 can specify the DUT 135 and the auxiliary module 120. The first physical netlist 155 further may specify one or more probes to be instantiated within, or as part of, the DUT 135. The EDA application 145 can convert the first physical netlist into the bitstream 160. The EDA application 145 then can send the bitstream 160 to the PLD 105, via the communication interface 150 and communication link 115. The PLD 105 can load the bitstream 160 into internal configuration memory cells, thereby instantiating the DUT 135 and the auxiliary module 120 therein.

As noted, the first physical netlist 155, and thus the bitstream 160, can specify one or more probes within the DUT 135. As used herein, a probe can refer to a physical route that couples a given signal path, e.g., another route, of the DUT 135 with the auxiliary module 120. The probes will be instantiated within PLD 105 as part of the DUT 135 and auxiliary module 120. Once instantiated, the DUT 135 can begin executing and operate according to the provided clock signal 170.

At some point a designer may determine that inclusion of a probe at one or more locations different from those originally specified within the DUT 135 would be desirable. The designer can provide an input to the EDA application 145 requesting a different probe location or locations. Responsive to the input, the EDA application 145 can send a command to the auxiliary module 120 to stop, or discontinue, the clock signal 170 provided to the DUT 135. Stopping the clock signal 170 allows the state of the DUT 135 to be preserved. The execution of the DUT 135 is temporarily halted.

The EDA application 145 can process the first physical netlist 155 by removing any probes that are no longer needed, e.g., are obsolete, to generate a modified physical netlist 185. Obsolete probes can be identified by the user input or automatically selected by the EDA application 145. Any new probes to be inserted into the DUT 135 can be specified first as connections within the modified physical netlist 185. For example connections can be added to the first physical netlist 155 to generate the modified physical netlist. Each connection can indicate a source and a load, but will not include physical routing information.

The re-entrant router 140 can generate a route for each connection added to the modified physical netlist 185 and generate a second physical netlist 190. The second physical netlist 190 will specify complete placement and routing information for the DUT 135, wherein any new probes have been inserted and any obsolete probes have been removed. The partial bitstream 175 can be generated based upon the second physical netlist 190 and the bitstream 160. The partial bitstream 175 can include only frames that have changed from the bitstream 160. The EDA application 145 further can request configuration data from the PLD 105 that coincides with the partial bitstream 175. State information can be determined from the read-back configuration data. The read-back configuration data can be merged with the partial bitstream 175.

The resulting configuration data, e.g., the updated partial bitstream 185, will specify the current and accurate state of the DUT 135 as well as updated routing information implementing the newly specified probes within the DUT 135. The updated partial bitstream 180 can be sent to the PLD 105 and loaded using ICAP 125, thereby instantiating the newly specified probes. Once instantiated, the EDA application 145 can send a command to the auxiliary module 120 to start the clock signal 170 to the DUT 135. Starting clock signal 170 starts execution of the DUT 135. As changed portions of the DUT 135 are controlled by the updated partial bitstream 180, which includes state information of the DUT 135 as of the stopping of the clock signal 170, the DUT 135 can continue executing without loss of state. That is, configuration data in the PLD 105 may be overwritten with new configuration data specifying new probes and the removal of obsolete probes. Such configuration data, however, can specify the same state for logic elements as the data being overwritten.

Figure 2:
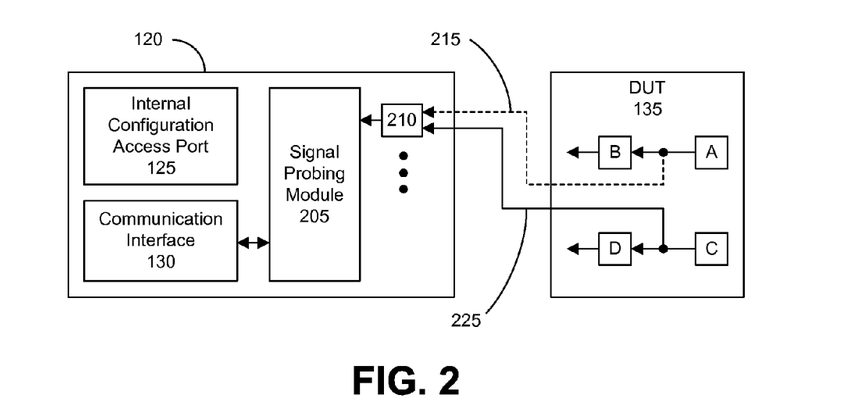
FIG. 2 is a block diagram illustrating reconfigurable signal probing within a PLD in accordance with another embodiment of the present invention.

FIG. 2 is a block diagram illustrating reconfigurable signal probing within a PLD in accordance with another embodiment of the present invention. FIG. 2 illustrates a process by which a probe is removed from the DUT 135 and a new probe is added to the DUT 135 to monitor a different signal. As shown, the auxiliary module 120 includes ICAP 125, the communication interface 130, and a signal probing module 205. The signal probing module 205 can receive signals from each probe that is routed to a probe register 210. Signals received via probe register 210 can be provided to the communication interface 130 and sent to the host computer (not shown).

Within DUT 135, a probe 215 can be instantiated to monitor signals passed along the signal path from source A to load B. Thus, signals output from source A can be provided to the probe register 210 via probe 215. After partial reconfiguration, probe 215 can be removed from the DUT 135. Once removed, signals passed between source A and load B will no longer be monitored or passed to the signal probing module 205. Partial reconfiguration of the PLD will instantiate a probe 225 within the DUT 135 to monitor signals passed along the signal path from source C to load D. Accordingly, signals passed from source C to load D can be provided to the probe register 210 via probe 225.

FIG. 2 illustrates operation of the re-entrant router in that once the probe 215 is removed from the physical netlist, the re-entrant router can establish probe 225, e.g., the route established from the signal path between source C and load D to probe register 210. No other existing components or routes need be changed or modified other than possibly the removal of probes or the insertion of probes. As illustrated in FIG. 2, probe 215 is removed and probe 225 is added, effectively changing the location and signal being probed within the DUT 135.

Figure 3:
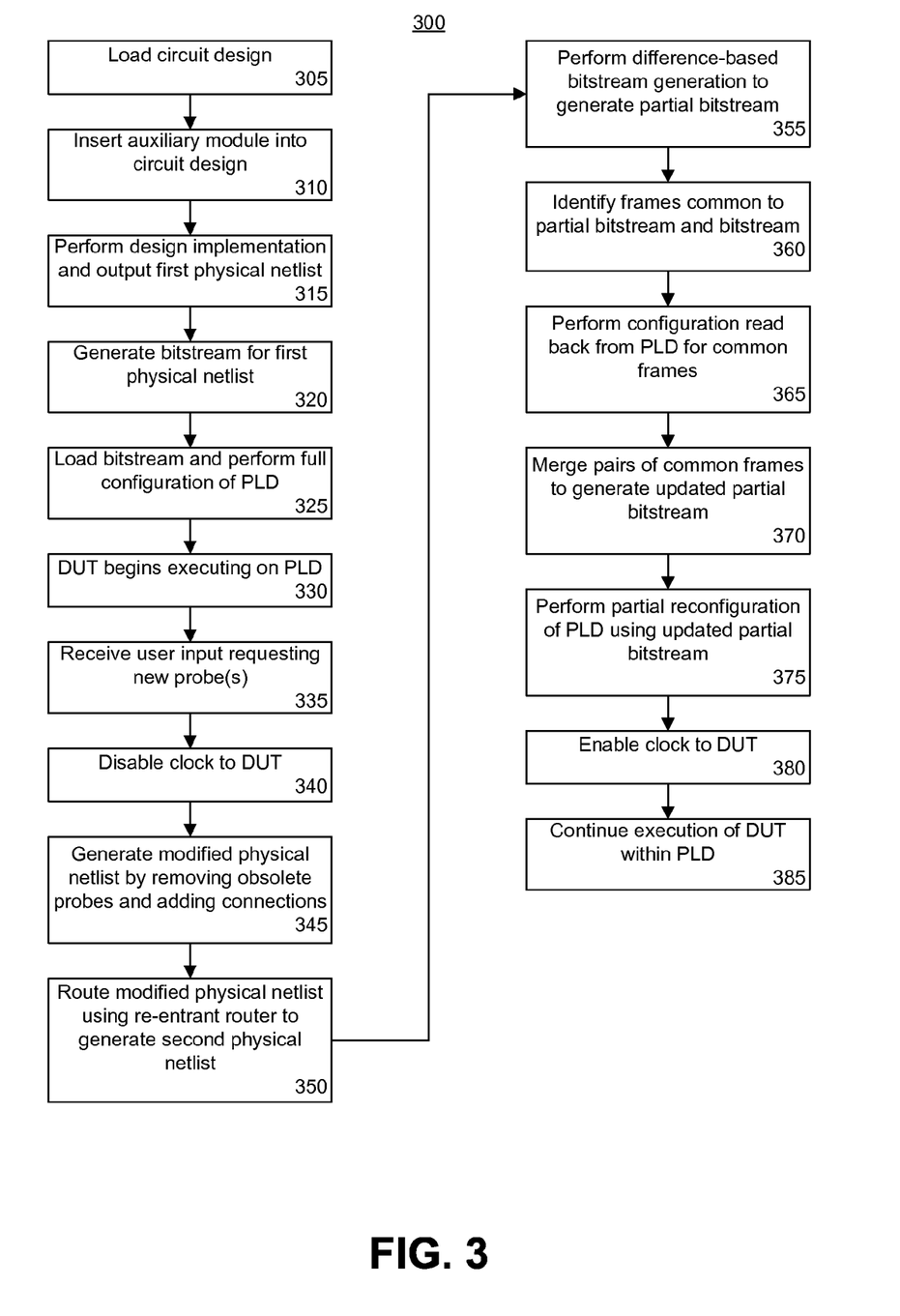
FIG. 3 is a flow chart illustrating a method of reconfiguring probes within a device under test (DUT) in accordance with another embodiment of the present invention.

FIG. 3 is a flow chart illustrating a method 300 of reconfiguring probes within a DUT in accordance with another embodiment of the present invention. The method can be performed by a system as described with reference to FIGS. 1 and 2. Accordingly, in step 305, a circuit design can be loaded into an EDA application. The circuit design can be specified in programmatic form as a collection of one or more hardware description language files, as a netlist, or the like. The circuit design can include, or specify, one or more probes that allow signals of interest to be monitored or sampled.

In step 310, the EDA application can insert a programmatic description of an auxiliary module into the circuit design. In step 315, the EDA application can perform design implementation on the circuit design and generate a first physical netlist. The EDA application can synthesize, map, place, and route the circuit description and output the first physical netlist. The first physical netlist can specify full placement and routing information for the circuit design as applied to a selected PLD.

In step 320, the EDA application can generate a bitstream from the first physical netlist. The bitstream can be output. In step 325, the bitstream can be loaded into the PLD to perform a full configuration of the PLD. The bitstream can be sent from the host computer to the PLD and loaded into configuration memory, thereby instantiating the auxiliary module and DUT, including any probes specified within the DUT.

In step 330, the DUT, being instantiated in the PLD, can begin executing as clock signals are provided to the DUT. In step 335, a user input can be received that requests the inclusion of one or more new probes within the DUT. The user input can specify such a request as well as particular signals that are to be probed within the DUT. Responsive to the user request, the method can proceed to step 340, where the clock signal provided to the DUT by the auxiliary module can be disabled or stopped. That is, the EDA application can issue a command to the PLD instructing the auxiliary module to stop providing a clock signal to the DUT.

In step 345, the EDA application can process the first physical netlist to generate and output a modified physical netlist. The EDA application can remove any probes that are obsolete. For example, probes, inclusive of routing information for such probes, that are no longer needed or used can be deleted from the physical first netlist. The particular probes for which routing information is removed can be determined automatically or can be user specified. The EDA application also can insert a connection for each probe to be added to the DUT. As noted, each connection specifies a source and a load, without routing information indicating which wires are to be used within the PLD to establish the physical path between the source and the load of the connection. Accordingly, the modified physical netlist differs from the first physical netlist in that the modified physical netlist will not specify any probes that have been removed and will include a connection for each probe to be added to the DUT.

In step 350, the modified physical netlist can be routed using a re-entrant routing function or technique to generate a second physical netlist. The re-entrant router does not disturb any existing routes or components within the modified physical netlist. Rather, the re-entrant router determines routing information for each connection that is added to the modified physical netlist, thereby creating the probes. The re-entrant router generates the second physical netlist, which specifies complete placement and routing information for the DUT inclusive of any newly added probes. The second physical netlist can be output. It should be appreciated that since routing data for obsolete probes has been removed, the second physical netlist specifies the removal of such obsolete probes in that no routing resources are devoted to the removed probes.

In step 355, the EDA application can perform difference-based bitstream generation to generate a partial bitstream. The EDA application can process the second physical netlist and generate the partial bitstream. The partial bitstream will specify only those frames of configuration data that differ from frames of configuration data of the bitstream. Accordingly, the partial bitstream will include only those frames specifying routing information that is different from the bitstream. The partial bitstream effectively specifies changed routing in consequence of removing obsolete probes from the DUT and adding new probes to the DUT.

In step 360, the EDA application can identify frames common between the partial bitstream and the bitstream. As used herein, the term "common" can mean that the frame exists in both the partial bitstream and in another set of configuration data for the PLD, e.g., the bitstream. Two common, or corresponding, frames will program the same portion or circuit elements of the PLD, but may include different configuration data. In this case, a frame from the partial bitstream will specify different routing information than a common frame in the bitstream. It should be appreciated that as the bitstream is loaded into the PLD, the partial bitstream will have frames common to the configuration data within the PLD.

In step 365, the EDA application can initiate a read-back operation with the PLD to read configuration data corresponding to each common frame. That is, each frame of configuration data, as loaded in the PLD, that is common to a frame of configuration data of the partial bitstream can be read-back from the PLD.

In step 370, the EDA application can merge pairs of common frames to generate an updated partial bitstream. The EDA application can parse the frames of configuration information read-back from the PLD and identify the portion of each frame that includes interconnect information. Similarly, interconnect information from each frame of the partial bitstream can be identified. The EDA application can replace the interconnect information of each frame of configuration data read-back from the PLD with the configuration data from each corresponding frame of the partial bitstream. That is, for each frame read from the PLD, the interconnect information from the frame of the partial bitstream that is common to the read-back frame can be inserted into the read-back frame.

This can be performed for each pair of common frames, with the result being an updated partial bitstream. The updated partial bitstream effectively includes all of the logic element state data, which specifies the state of logic elements from the DUT as of the moment the DUT clock was disabled, and the interconnect information from the partial bitstream. The interconnect information from the partial bitstream specifies routes for the newly defined probes and, by virtue of the lack of routing information, the removal of obsolete probes.

It should be appreciated that a similar result can be obtained by replacing the logic element state information of each frame of the partial bitstream with logic element state information parsed from corresponding frames of configuration data read-back from the PLD. Both procedures can result in the same updated partial bitstream including updated routing information reflecting newly added probes and the removal of obsolete probes and state information obtained via the read-back operation.

In step 375, the EDA tool can perform partial reconfiguration of the PLD. The EDA application can transmit the updated partial bitstream to the PLD. The ICAP within the auxiliary module can implement the partial reconfiguration. As noted, only those frames of the configuration data of the PLD that control changed routing resources are updated, e.g., the frames of configuration data in the PLD corresponding to the frames specified by the updated partial bitstream.

In step 380, after the PLD has been partially reconfigured, the DUT clock can be enabled or started. The EDA application can send a command to the PLD instructing the auxiliary module to start the DUT clock. In step 385, with the clock to the DUT being enabled, the DUT can continue execution with the newly specified probes. It should be appreciated that by stopping the DUT clock and utilizing the state information for logic elements obtained from the read-back frames, the DUT can continue operation from the same state in which the DUT was stopped prior to partial reconfiguration. That is, the new probes can be seamlessly inserted into the DUT without the DUT losing state.

It should be appreciated that the technique described with reference to FIG. 3 can be repeated as may be desired responsive to further requests to probe different or further signals of the DUT. For example, the method 300 can loop back to step 340 responsive to each received user input requesting a change in probed signals.

Figure 4:
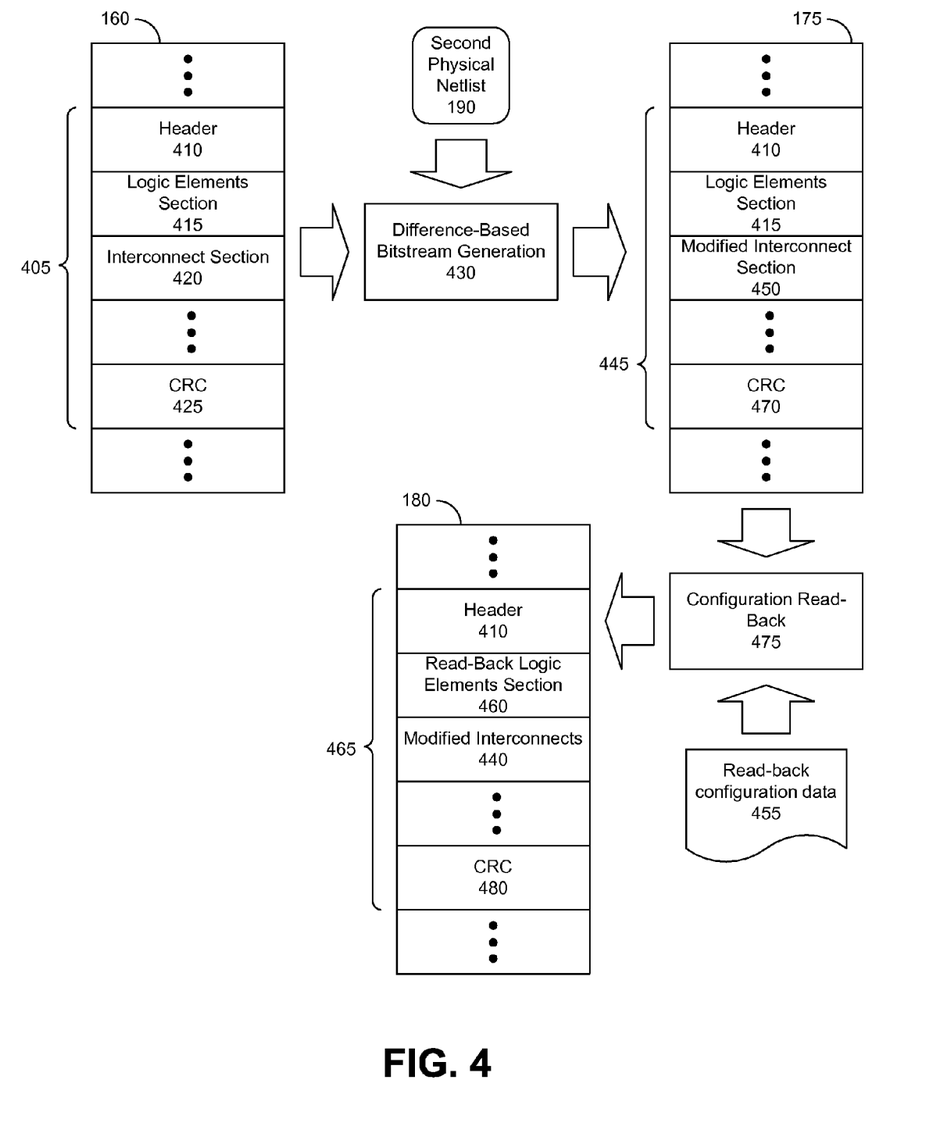
FIG. 4 is a block diagram illustrating a technique for reconfiguring probes within a DUT in accordance with another embodiment of the present invention.

FIG. 4 is a block diagram illustrating a technique for reconfiguring probes within a DUT in accordance with another embodiment of the present invention. More particularly, FIG. 4 illustrates how a frame for the updated partial bitstream can be created. Frame 405 can be a frame of configuration data from the bitstream 160 used to program the PLD as discussed with reference to FIG. 1. As noted, bitstream 160 can specify the auxiliary module and the DUT. The DUT may include one or more probes. It should be appreciated that in some instances, the DUT may not include any probes. In that case, obsolete probes need not be removed. New probes may, however, be added.

As shown, frame 405 can include several different sections, each named according to the type of configuration data expressed. Frame 405 can include a header 410, a logic elements section 415, an interconnect section 420, and a Cyclic Redundancy Check (CRC) 425. The header 410 can indicate the particular location in configuration memory of the PLD in which the frame 405 is to be stored along with other administrative data that may be needed, e.g., a unique identifier of the frame 405 within the bitstream 160.

The logic elements section 415 can specify configuration data for logic elements of the PLD that are programmed, or at least partially programmed, by frame 405. Logic elements section 415 also can specify state information for such circuit elements. For example, the logic elements 415 section of the frame 405 can indicate whether a given logic element, e.g., a gate, a multiplexer, etc., is at a logic high or a logic low, the memory contents of components such as Block Random Access Memories, and the like. The interconnect section 420 can specify routing information for the portion of the PLD that is configured by frame 405. The CRC 425 allows the integrity of frame 405 to be checked after transmission to the PLD.

The bitstream 160, with frame 405, can be processed through a difference-based bitstream generation block 430 (block 430), representing a processing function of the EDA application. Block 430 can process the second physical netlist 190, which specifies new probes, with reference to bitstream 160. Block 430 can create and output the partial bitstream 175. The partial bitstream 175 can include only frames of configuration data that are different from a corresponding frame of configuration data in the bitstream 160.

For example, frame 445 can be a frame included within the partial bitstream 175. Frame 445 can be a modified version of frame 405. As shown, frame 445 includes a same header 410 and a same logic elements section 415 as frame 405. The CRC section 470 of frame 445 will be different from CRC section 425 of frame 405 due to the modified portions of the partial bitstream. The interconnect data of frame 445 has been changed to modified interconnect section 450, specify routing information for the newly added probes as specified in the second physical netlist 190. As noted, the modified interconnect section 450 will also indicate removal of obsolete probes in that no routing information for obsolete probes will be specified.

A configuration read-back block 475 (block 475) representing a configuration read-back function of the EDA application can operate upon the partial bitstream 175. Block 475 can identify pairs of corresponding frames. For example, block 475 can determine each frame of the partial bitstream 175, e.g., frame 445, and identify the frame of the bitstream 160, e.g., frame 405, that corresponds to frame 445 of the partial bitstream 175.

Block 475 can initiate a read-back operation from the PLD to obtain the portions of configuration data in the PLD that correspond to each frame of the bitstream 160 that has been identified as part of a pair of common frames as described with reference to FIG. 3. For example, block 475 can obtain the portion of configuration data from the PLD that corresponds to frame 405 and/or 445 as the case may be. The configuration data, or frame, read-back from the PLD will include an interconnect section that is the same as interconnect section 420 of frame 405. The logic elements section, however, may differ in that the configuration data read from the PLD may have state information for the logic elements that differs from that specified in logic elements section 415 in consequence of the executing DUT.

In any case, block 475 can process each of the frames of the partial bitstream 175 to generate and output the updated partial bitstream 180. The updated partial bitstream 180 can be created by incorporating or merging each frame of the partial bitstream 175 with a corresponding frame of read-back configuration data 455 from the PLD. For example, the logic elements section 415 of frame 445 can be replaced with read-back logic elements section 460 that is obtained from a corresponding frame of the read-back configuration data 455. The CRC section 480 can be recalculated and inserted into frame 465 to reflect any changes that occur as a consequence of merging the partial bitstream 175 with the read-back configuration data 455. Frame 445, through the merger, is transformed into frame 465 within the updated partial bitstream 180.

The updated partial bitstream 180 specifies configuration data for only those portions of the PLD that must change to implement the newly defined probes of the second physical netlist 190 and/or remove obsolete probes. As noted, the updated partial bitstream 180 can be sent to the PLD to partially reconfigure the PLD. After reconfiguration, the DUT within the PLD will include any newly specified probes and continue execution without losing state.

As noted, rather than replacing interconnect data of frames read back from the PLD, logic element state information of frames of the partial bitstream 175 can be replaced with current logic element state information obtained from the PLD to generate the updated partial bitstream 180. In any case, the term "merging," as used herein, is intended to cover both scenarios as well as the generation of a completely new updated bitstream 180 including elements of data from the configuration data read-back from the PLD and elements of data obtained from the partial bitstream 175.

The embodiments disclosed herein provide a technique for reconfiguring probes within a PLD. Obsolete probes can be removed and new probes inserted into a DUT through the use of a rapid re-routing technique which utilizes a re-entrant router. The DUT can continue to execute, with reconfigured probes, without excessive processing delays or loss of state.

The flowchart in the figures illustrates the architecture, functionality, and operation of possible implementations of systems, methods and computer program products according to various embodiments of the present invention. In this regard, each block in the flowchart may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustration, and combinations of blocks in the flowchart illustration, can be implemented by special purpose hardware-based systems that perform the specified functions or acts, or combinations of special purpose hardware and computer instructions.

Embodiments of the present invention can be realized in hardware, software, or a combination of hardware and software. The embodiments can be realized in a centralized fashion in one data processing system or in a distributed fashion where different elements are spread across several interconnected data processing systems. Any kind of data processing system or other apparatus adapted for carrying out the methods described herein is suited. A typical combination of hardware and software can be a general-purpose computer system with a computer program that, when being loaded and executed, controls the computer system such that it carries out the methods described herein.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, one or more portions of a wired or wireless network through which computer-usable program code can be propagated, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A method of probing a design under test (DUT) instantiated within programmable logic, the method comprising:
    disabling a clock signal provided to the DUT within the programmable logic;
    generating, by a computer, a partial bitstream comprising a new probe for the design under test, wherein generating a partial bitstream comprises:
        specifying a connection for the new probe, wherein the connection does not specify routing information for the new probe; and
        determining a route for the connection;
    merging, by the computer, the partial bitstream with configuration data read-back from the programmable logic to create an updated partial bitstream;
    loading the updated partial bitstream into the programmable logic; and
    starting the clock signal provided to the programmable logic, wherein the design under test continues to operate.

2. The method of claim 1, wherein the design under test continues to operate with the new probe without loss of state.

3. The method of claim 1, further comprising removing an obsolete probe by deleting routing information for the obsolete probe from a physical netlist for the design under test, wherein the partial bitstream specifies removal of the obsolete probe.

4. The method of claim 1, wherein generating a partial bitstream comprises generating the partial bitstream to include only frames that specify at least one of the new probe or removal of the obsolete probe.

5. The method of claim 1, wherein merging the partial bitstream with configuration data read-back from the programmable logic comprises:
    identifying each frame of the partial bitstream;
    reading back a frame from the programmable logic that corresponds to each frame of the partial bitstream; and
    merging each frame of the partial bitstream with the corresponding frame read-back from the programmable logic.

6. The method of claim 1, wherein merging the partial bitstream with configuration data read-back from the programmable logic comprises:
    identifying each frame from the partial bitstream;
    reading back a frame from the programmable logic that corresponds to each frame of the partial bitstream; and
    generating the updated partial bitstream by combining logic element state information from each frame read-back from the programmable logic and interconnect data from each corresponding frame of the partial bitstream.

7. The method of claim 1, wherein generating a partial bitstream comprises:
    adding a connection to the physical netlist specifying the new probe; and
    routing the connection using a re-entrant routing function, wherein pre-existing routing information of the physical netlist is not disturbed and routing information for the new probe is added.

8. The method of claim 1, wherein merging the partial bitstream with configuration data read-back from the programmable logic comprises forming the updated partial bitstream by replacing routing data of the portions of configuration data read-back for the programmable logic with routing data from the partial bitstream.

9. A method of probing a design under test (DUT) instantiated within programmable logic of an integrated circuit device, the method comprising:
    disabling a clock signal to the design under test, wherein the design under test is instantiated by a bitstream loaded into the programmable logic;
    removing an obsolete probe from a physical netlist of the design under test;
    adding a connection for a new probe to the physical netlist;
    creating a route, by a computer, within the physical netlist, for the connection;
    generating, by the computer, a partial bitstream comprising only frames that differ from corresponding frames of the bitstream;
    reading each frame of configuration data from the programmable logic corresponding to a frame of the partial bitstream;
    merging, by the computer, frames of the partial bitstream with corresponding frames of the configuration data read from the programmable logic to create an updated partial bitstream;
    loading the updated partial bitstream into the programmable logic; and
    starting the clock signal to the design under test, wherein the design under test continues to operate without losing state.

10. The method of claim 9, wherein merging frames comprises replacing routing data of the frames of the configuration data read from the programmable logic with routing data from the frames of the partial bitstream to generate the updated partial bitstream.

11. The method of claim 9, wherein generating a partial bitstream comprises outputting, as the partial bitstream, only frames of configuration data that differ from corresponding frames of the bitstream.

12. A non-transitory computer-readable medium having written thereon instructions that, when loaded in a computer system, cause the computer system to implement a method of probing a design under test, the method comprising:
    probing a design under test (DUT) instantiated within programmable logic of an integrated circuit;
    disabling a clock signal within the design under test;
    generating a partial bitstream comprising a new probe for the DUT, wherein generating a partial bitstream comprises:
        specifying a connection for the new probe, wherein the connection does not specify routing information for the new probe; and
        determining a route for the connection;
    merging the partial bitstream with configuration data read-back from the programmable logic to create an updated partial bitstream;

loading the updated partial bitstream into the programmable logic; and starting the clock signal provided to the programmable logic, wherein the design under test continues to operate.

13. The computer-readable medium of claim 12, wherein the design under test continues to operate with the new probe without loss of state.

14. The computer-readable medium of claim 12, further comprising removing an obsolete probe by deleting routing information for the obsolete probe from a physical netlist for the DUT, wherein the partial bitstream specifies the removal of the obsolete probe.

15. The computer-readable medium of claim 12, wherein generating a partial bitstream comprises including only frames that specify at least one of the new probe or removal of the obsolete probe.

16. The computer-readable medium of claim 12, wherein merging the partial bitstream with configuration data readback from the programmable logic comprises:

identifying each frame of the partial bitstream;

reading back a frame from the programmable logic that corresponds to each frame of the partial bitstream; and generating the updated partial bitstream by combining logic element state information from each frame readback from the programmable logic and interconnect data from each corresponding frame of the partial bitstream.

17. The computer-readable medium of claim 12, wherein generating a partial bitstream comprises:

adding a connection to the physical netlist specifying the new probe; and routing the connection using a re-entrant routing function, wherein pre-existing routing information of the physical netlist is not disturbed and routing information for the new probe is added.

18. The computer-readable medium of claim 12, wherein merging the partial bitstream with configuration data readback from the programmable logic comprises forming the updated partial bitstream by replacing routing data of the portions of configuration data read-back for the programmable logic with routing data from the partial bitstream.

* * * * *